United States Patent [19]

Nakashiba

[11] Patent Number: 5,585,653

[45] Date of Patent: Dec. 17, 1996

[54] SOLID-STATE PHOTOELECTRIC IMAGING DEVICE WITH REDUCED SMEARING

[75] Inventor: Yasutaka Nakashiba, Tokyo, Japan

[73] Assignee: NEC Corporation, Tokyo, Japan

[21] Appl. No.: 573,366

[22] Filed: Dec. 15, 1995

Related U.S. Application Data

[63] Continuation of Ser. No. 282,475, Jul. 29, 1994, abandoned.

[30] Foreign Application Priority Data

Jul. 30, 1993 [JP] Japan .................................. 5-207016

[51] Int. Cl.$^6$ ...................... H01L 27/148; H01L 29/768
[52] U.S. Cl. ...................... 257/232; 257/233; 257/249; 257/435; 257/637; 257/640
[58] Field of Search ...................... 257/232, 233, 257/249, 435, 637, 640

[56] References Cited

U.S. PATENT DOCUMENTS

| | | | |
|---|---|---|---|
| 4,914,493 | 4/1990 | Shiromizu | 257/232 |
| 5,181,093 | 1/1993 | Kawaura | 257/233 |
| 5,306,926 | 4/1994 | Yonemoto | 257/233 |
| 5,334,867 | 8/1994 | Shin et al. | 257/232 |
| 5,424,775 | 6/1995 | Kamisaka et al. | 257/232 |

FOREIGN PATENT DOCUMENTS

| | | | |
|---|---|---|---|
| 61-49467 | 3/1986 | Japan . | |
| 61-174772 | 8/1986 | Japan | 257/249 |
| 2-237068 | 9/1990 | Japan | 257/233 |

OTHER PUBLICATIONS

Yasuo Ihsihara et al., "A High Photosensitivity IL-CCD Image Sensor With Monolithic Resin Lens Array," *IEDM*, 1983, pp. 497–500.

Nobukazu Teranishi et al., "Smear Reduction in the Interline CCD Image Sensor," *IEEE Transactions on Electron Devices*, vol. ED-34, No. 5, May 1987, pp. 1052–1056.

*Primary Examiner*—Ngân V. Ngô
*Attorney, Agent, or Firm*—Burns, Doane, Swecker & Mathis, LLP

[57] ABSTRACT

A solid-state imaging device which restrains the smear phenomenon effectively without reduction of the dielectric breakdown strength between the transfer electrode and the light shielding film. A first insulating film covers photoelectrical converting regions each of which receives incident light through the first insulation film to generate and store a signal charge. A second insulating film covering a charge transfer region is of a layered structure containing a first insulation layer with a relatively lower dielectric constant such as $SiO_2$ and a second insulation layer with a relatively higher dielectric constant such as $Si_3N_4$. The distance between the transfer electrode and the light shielding film can be decreased, providing decrease in thickness of the first insulating film. The smear phenomenon is restrained effectively without reduction of the dielectric breakdown strength between the transfer electrode and the light shielding film.

4 Claims, 6 Drawing Sheets

SOLID-STATE PHOTOELECTRIC IMAGING DEVICE WITH REDUCED SMEARING

This application is a continuation of application No. 08/282,475, filed Jul. 29, 1994, now abandoned.

BACKGROUND OF THE INVENTION

1. Field of the Invention

The present invention relates to solid-state imaging devices and more particularly, to solid-state imaging devices of one- or two-dimensions using a charge transfer device such as a charge coupled device (CCD).

2. Description of the Related Art

Compared to an image pickup tube which has been popularly used for imaging, a solid-state imaging device has many advantages such as compactness, light-weight, supreme endurance, low-power consumption, and little residual image, little sticking.

In recent years, solid-state imaging devices have already become more popular then image pickup tubes in private use, such as in movie cameras where the applicable image size is relatively small. Also in business use, such as a television camera where the applicable image size is relatively large, solid-state imaging devices are close to replacing image pickup tubes.

FIG. 6 schematically shows a solid-state imaging device of the interline transfer type.

In FIG. 6, a plurality of photoelectric conversion sections 31 are arranged in a matrix array. Each of the photoelectric conversion sections 31 receives incident light to generate and store an electrical signal charge according to the intensity of the incident light thus received.

A plurality of vertical charge transfer sections 32 are arranged along the respective columns of the matrix. Each of the vertical charge transfer sections 32 reads out the signal charges stored in the photoelectric conversion sections 31 of each column to transfer vertically the signal charges thus read to a horizontal transfer section 33.

The horizontal transfer section 33 transfers the signal charges from the vertical charge transfer sections 32 horizontally to a output section 34.

The output section 34 converts the signal charges from the horizontal transfer section 33 to a voltage be output.

FIG. 1 shows a first example of the conventional solid-state imaging device with the above structure shown in FIG. 6, in which a cross-sectional view along the line 1—1' is drawn.

A p-well layer 402 is formed on an n-semiconductor substrate 401. In the photoelectric conversion section 31, there are formed a $p^+$-photoelectric conversion region 404 and a $p^+$-channel stop region 406 for isolation, both of which are connected with each other, in the surface area of the p-well layer 402. An n-photoelectric conversion region 403 is formed under the $p^+$-photoelectric conversion region 404. The $p^+$- and n-photoelectric conversion regions 404 and 403 form a photoelectric conversion member or photodiode.

In the charge transfer section 32, there is formed an n-charge transfer region 405 in the surface area of the p-well layer 402. One end (left-hand end in FIG. 1) of the n-charge transfer region 405 is apart from the $p^+$-photoelectric conversion region 404 and the other end (right-hand end in FIG. 1) is connected to a $p^+$-channel stop region 406 in an adjacent one of the photoelectric conversion sections 31.

An insulation film 408 of silicon dioxide ($SiO_2$) is formed on the surface of the p-well layer 402 to cover both of the photoelectric conversion section 31 and the charge transfer section 32.

A transfer electrode 407 made of polysilicon is formed within the $SiO_2$ insulation film 408 in the charge transfer section 32. Between the transfer electrode 407 and the surface of the p-well layer 402, there is a part of the $SiO_2$ insulation film 408. One end (left-hand end in FIG. 1) of the electrode 407 is extending to the end (right-hand end in FIG. 1) of the $p^+$-photoelectric conversion region 404 and the other end (left-hand end in FIG. 1) is extending to the end (left-hand end in FIG. 1) of the n-photoelectric conversion region 403 in the adjacent one of the photoelectric conversion sections 31.

In the charge transfer section 32, a light shielding film 410 of metal is formed on the $SiO_2$ film 408 to prevent the incident light from entering the p-well layer 402 in the charge transfer section 32. The light shielding film 410 is not formed in the photoelectric converting section 31.

A protection film 411 of $SiO_2$ is formed to cover the light shielding film 410 and the $SiO_2$ insulation film 408 exposed from the film 410.

With the solid-state imaging device described above, when the incident light enters the $p^+$- and n-photoelectric conversion regions 404 and 403 forming the photodiode through the passivation film 411 and the insulation film 408, the light is converted to generate a signal charge and the signal charge thus generated is temporarily stored therein.

Under application of a driving voltage into the transfer electrode 407, the signal charge in the photodiode is moved through a field shift gate 412 to the charge transfer section 32, and then transferred vertically toward the horizontal transfer section 33.

All of the photoelectric converting sections 31 belonging to the respective columns operate in the same way as described above in response to the driving voltage. As a result, the signal charges stored in the photoelectric converting sections 31 are successively transferred through the respective vertical transfer sections 32 to the horizontal transfer section 33. The signal charges are then transferred to the output section 34 by the horizontal transfer section 33 and are converted to an output voltage signal in the output section 34 to be outputted therefrom.

With the solid-state imaging device described above, there arises a phenomenon called "smear" that worsen the image quality, which is never seen in the image pickup tube. The "smear" phenomenon occurs due to the following cause:

When picking up a subject of high-level luminance, the incident light entering the photoelectric converting section reaches also the neighborhood of the vertical transfer section 32 due to diffraction of the incident light. The light entered the neighborhood of the section 32 excites some electric charges therein and the charges leak into the vertical transfer section 33. As a result, a false or error signal is generated to be outputted from the output section 34, providing deterioration in image quality.

To restrain the smear phenomenon, solid-state imaging devices as shown in FIGS. 2 and 3 have been developed, which are disclosed in the paper by Y. ISHIHARA ET AL, entitled "A HIGH PHOTOSENSITIVITY IL-CCD IMAGE SENSOR WITH MONOLITHIC RESIN LENS ARRAY", IEDM, 83 PP497–500 (1983) and in the JAPANESE UNEXAMINED PATENT PUBLICATION NO. 61-49467, respectively.

The second example of the conventional solid-state imaging devices in FIG. 2 is the same in configuration as that shown in FIG. 1 excepting that a flattening film 520 is formed on the light shielding film 410 and the insulation film 408 instead of the protection film 411 and that an array of microlenses 521 are arranged on the flattening film 520 at positions corresponding to the respective photoelectric converting sections 31. The microlenses 521 are made of photosensitive polymer resin.

In the device shown in FIG. 2, the incident light is collected into the centers of the respective photoelectric converting sections 31 by the array of the microlenses 521 to prevent the incident light from entering the neighborhood of the vertical transfer section 32.

The third example of the conventional solid-state imaging devices in FIG. 3 is the same in configuration as that shown in FIG. 1 except that a silicon nitride ($Si_3N_4$) film 620 is formed on the light shielding film 410 and the insulation film 408 instead of the protection film 411 and that an $SiO_2$ protection film 611 is formed on the $Si_3N_4$ film 620.

In the device shown in FIG. 3, the incident light is collected into the centers of the respective photoelectric converting sections 31 by the $Si_3N_4$ film 620 due to the refractive index difference between the $SiO_2$ film 408 and the $Si_3N_4$ film 620.

The conventional solid-state imaging device shown in FIGS. 2 and 3 have the following problems:

With the device in FIG. 2, when the microlens 521 are optimized in curvature and height for the incident light with the given or designed angle of incidence, the incident light without the designed angle of incidence is collected to a point or area shifted from the designed collection point or area. As a result, the obtainable effect of restraining the smear phenomenon is not sufficient.

With the device in FIG. 3, when the $Si_3N_4$ film 620 is optimized in refractive index and thickness for the incident light with the given or designed angle of incidence, the obtainable effect of restraining the smear phenomenon is not sufficient due to the same reason as that in FIG. 2.

To solve the above problems, with the type of the conventional solid-state imaging device shown in FIG. 1, the distance $d_1'$ between the $p^+$-photoelectric conversion region 404 and the $SiO_2$ protection film 411 is set smaller to restrain the diffraction effect of the incident light, providing reduced quantity of the incident light into the neighborhood of the charge transfer section 32. This is disclosed in the paper by T. TERAHASHI ET AL, entitled "A FLAME INTERLINE TRANSFER CCD IMAGE SENSOR FOR HDTV CAMERA SYSTEM", IEEE TRANSACTIONS ON ELECTRON DEVICES, VOL.ED-34, PP1052–1056 (1987).

With the conventional solid-state imaging device shown in FIG. 1, as the distance $d_1'$ between the $p^+$-photoelectric conversion region 404 and the $SiO_2$ protection film 411 is set smaller, the distance $d_2'$ between the transfer electrode 407 and the light shielding film 410 decreases. Therefore, there arises a problem that the distance $d_1'$ is set excessively small, the dielectric breakdown strength between the transfer electrode 407 and the light shielding film 410 decreases remarkably.

As a result, the distance $d_1'$ cannot be set so small that the smear phenomenon is sufficiently restrained.

For example, in the case that the transfer electrode 407 is made of a polysilicon film doped with phosphorus and produced by a thermal oxidation process, the insulation film 408 is made of an $SiO_2$ film produced by a thermal oxidation process, and the light shielding film 410 is made of an aluminum (Al) film, the $SiO_2$ insulating film 408 is required to be approximately 200 nm in thickness.

SUMMARY OF THE INVENTION

Accordingly, an object of the present invention is to provide a solid-state imaging device which can restrain the smear phenomenon effectively without reduction of the dielectric breakdown strength between the transfer electrode and the light shielding film.

A solid-state imaging device according to the present invention contains photoelectrical converting regions formed at a semiconductor substrate and a charge transfer region formed at the substrate.

A first insulating film covers the photoelectrical converting regions. Each of the photoelectrical converting regions receives incident light through the first insulation film to generate and store a signal charge according to the incident light.

A second insulating film covers the charge transfer region. The second insulating film is of a layered structure containing a first insulation layer with a relatively lower dielectric constant and a second insulation layer with a relatively higher dielectric constant.

The signal charge stored in the photoelectrical converting regions are transferred through the charge transfer region in response to a transfer signal applied to the transferring electrodes.

A light shielding film covers the charge transfer region to prevent the incident light from entering the charge transfer region. The light shielding film has windows over the respective photoelectrical converting regions so that the incident light enter the photoelectrical converting regions through the windows.

The first insulating film may be made of the same material as that of the first insulation layer with a relatively lower dielectric constant of the second insulating film, or may be made of a different material from the first insulation layer.

In a preferred embodiment, the first insulating film is of a layered structure containing a third insulation layer and a fourth insulation layer. The third and fourth insulation layers are made of the same material as that of the first insulation layer of the second insulating film.

In the case that the first insulating film is of a layered structure containing a third insulation layer and a fourth insulation layer, preferably, the third insulation layer is made of the same material as that of the first insulation layer of the second insulating film, and the fourth insulation layer is made of the same material as that of the second insulation layer thereof.

It is preferable that the third insulation layer covers the entirety of light-receiving surfaces of the respective photoelectrical converting regions, and the fourth insulation layer is formed in peripheries of the respective light-receiving surfaces of the photoelectrical converting regions.

The first insulation layer is preferably made of silicon oxide and the second insulation layer is preferably made of silicon nitride.

With the solid-state imaging device of the present invention, the second insulating film covering the surface of the charge transfer region is of a layered structure, and this structure contains a first insulation layer with a relatively lower dielectric constant and a second insulation layer with a relatively higher dielectric constant. Therefore, the distance between the transfer electrode and the light shielding film can be decreased compared with that containing only the first insulation layer. This means that the thickness of the first insulating film can be decreased.

Accordingly, the diffraction of the incident light is reduced so that the smear phenomenon can be restrained effectively without reduction of the dielectric breakdown strength between the transfer electrode and the light shielding film.

DETAILED DESCRIPTION OF THE PREFERRED EMBODIMENT

Figure 1:
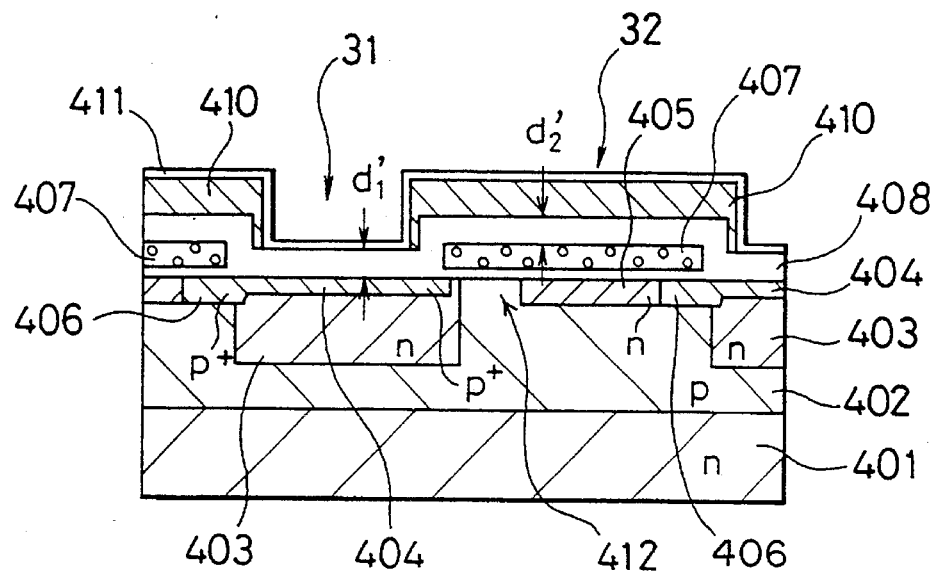
FIG. 1 shows a cross-sectional view along the line 1—1' in FIG. 6 of a first example of the conventional solid-state imaging device.

Preferred embodiments of the present invention will be described below referring to the drawings attached.

FIRST EMBODIMENT

Figure 4A:
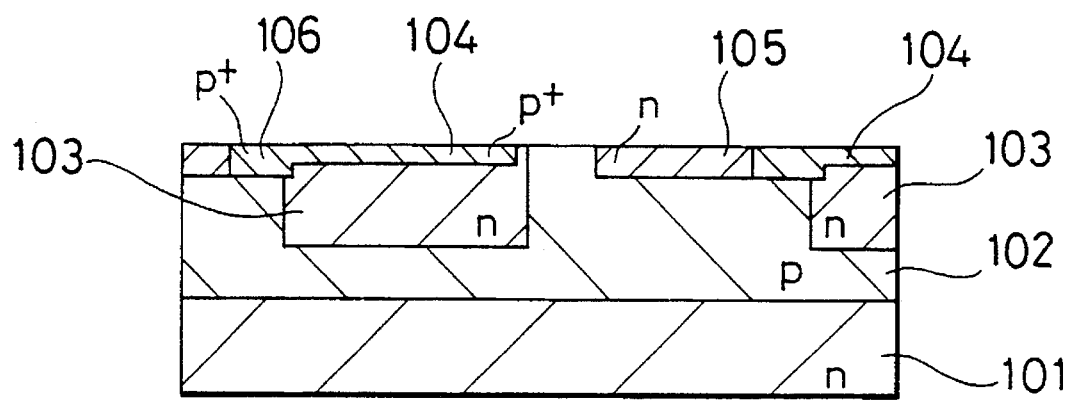
FIGS. 4A to 4D are cross-sectional views along the line 1—1' in FIG. 6 showing a fabrication sequence of a solid-state imaging device according to a first embodiment of the present invention, respectively.
Figure 4B:
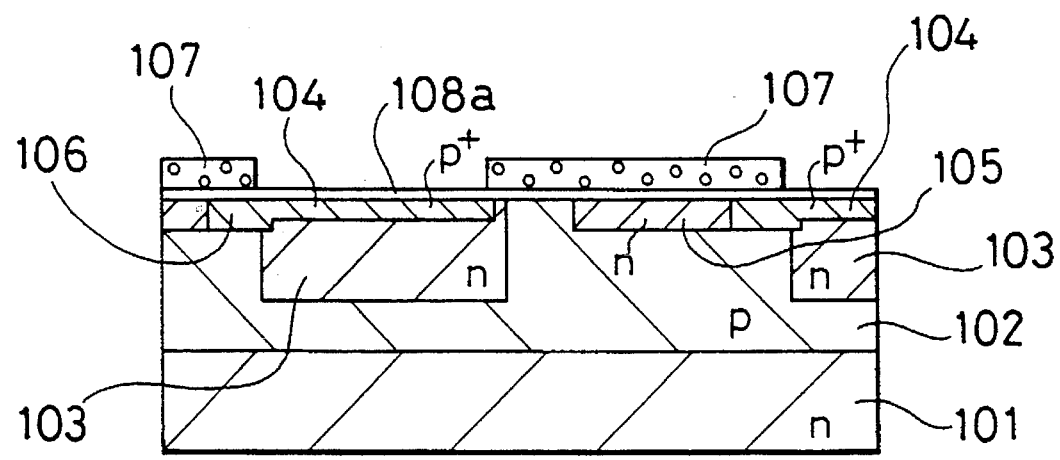
Figure 4C:
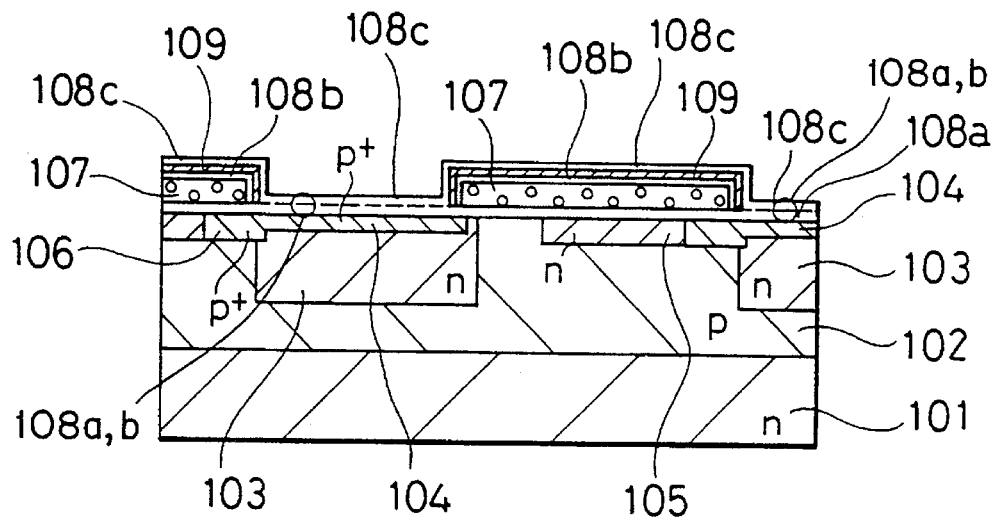
Figure 4D:
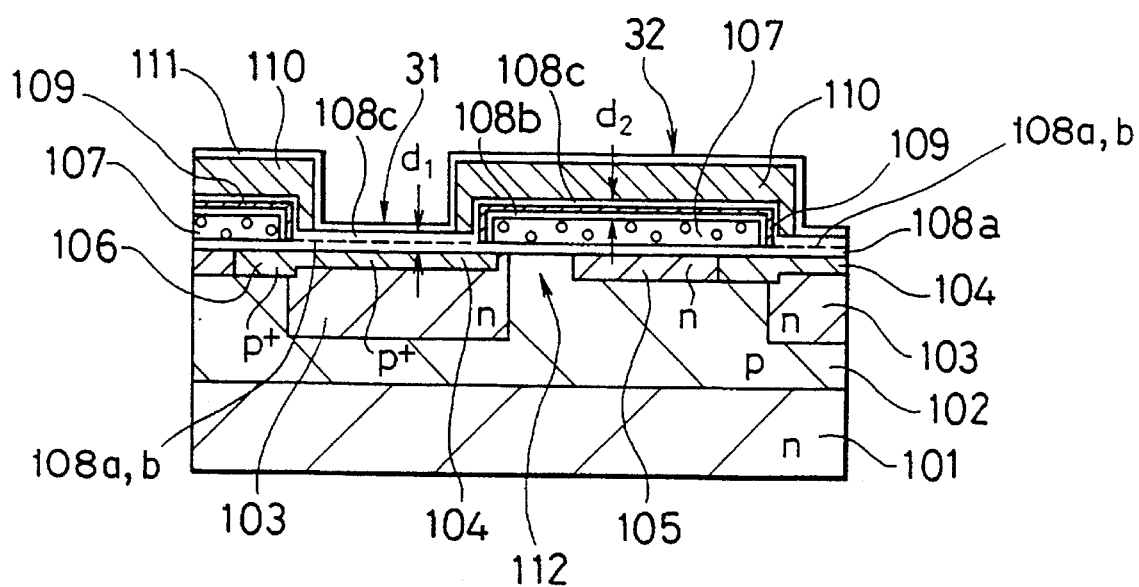

FIG. 4D shows a solid-state imaging device of the interline transfer type according to a first embodiment.

In FIG. 4D, a p-well layer 102 is formed on an n-semiconductor substrate 101. In the photoelectric conversion section 31, there are formed a $p^+$-photoelectric conversion region 104 and a $p^+$-channel stop region 106 for isolation, both of which are connected with each other, in the surface area of the p-well layer 102. An n-photoelectric conversion region 103 is formed under the $p^+$-photoelectric conversion region 104. The $p^+$- and n-photoelectric conversion regions 104 and 103 form a photoelectric conversion member or photodiode.

In the charge transfer section 32, there is formed an n-charge transfer region 105 in the surface area of the p-well layer 102. One end (left-hand end in FIG. 4D) of the n-charge transfer region 105 is apart from the $p^+$-photoelectric conversion region 104 and the other end (right-hand end in FIG. 4A) is connected to a $p^+$-channel stop region 106 in an adjacent one of the photoelectric conversion sections 31.

Figure 2:
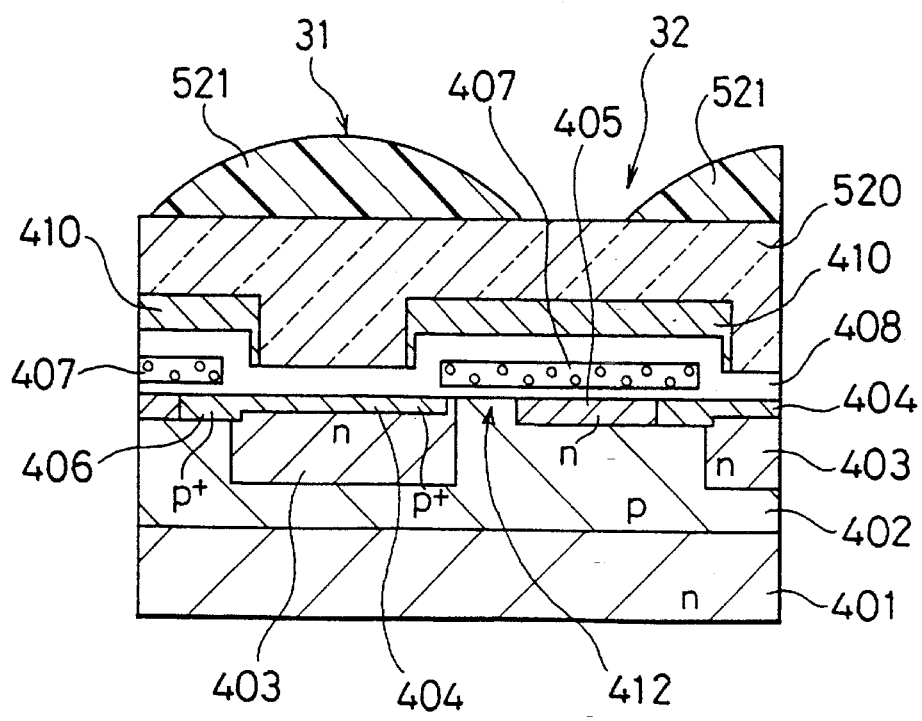
FIG. 2 shows a cross-sectional view along the line 1—1' in FIG. 6 of a second example of the conventional solid-state imaging device.
Figure 3:
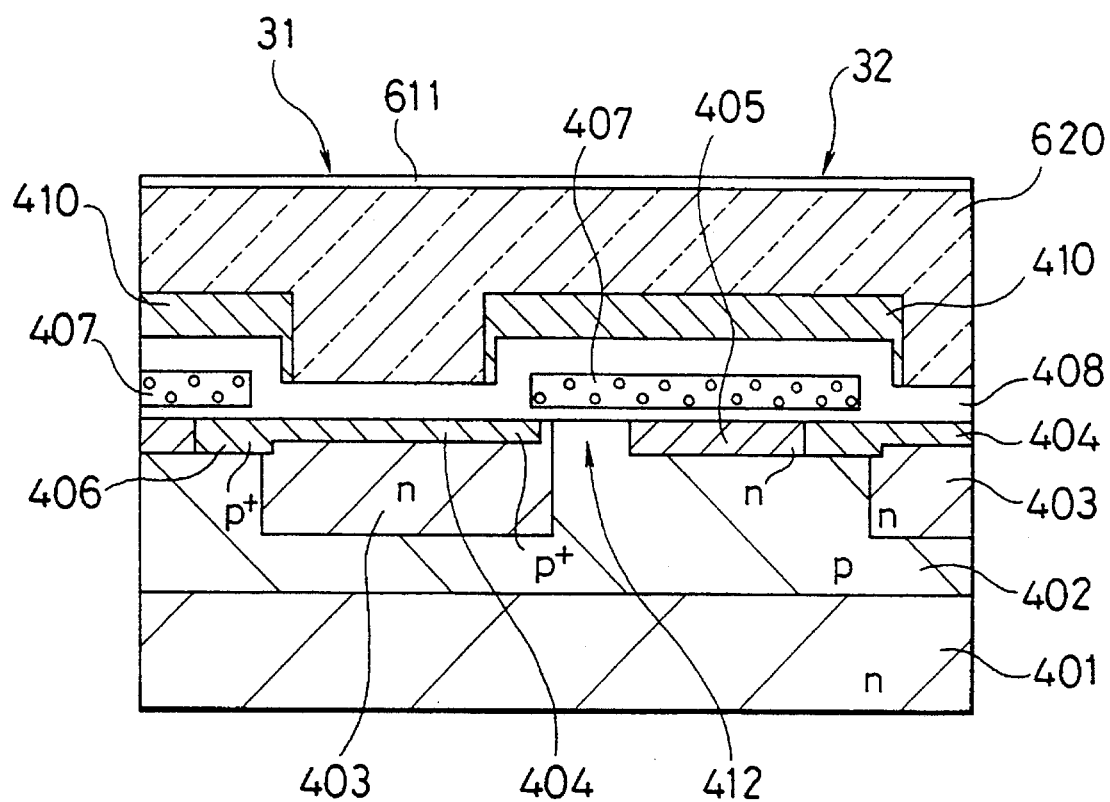
FIG. 3 shows a cross-sectional view along the line 1—1' in FIG. 6 of a third example of the conventional solid-state imaging devices.

The above described structure is the same as that of the conventional solid-state imaging devices shown in FIGS. 1, 2 and 3.

An insulation layer 108a of $SiO_2$ is formed on the surface of the p-well layer 102 to cover both of the photoelectric conversion section 31 and the charge transfer section 32.

A transfer electrode 107 made of polysilicon is formed on the $SiO_2$ insulation layer 108a in the charge transfer section 32. One end (left-hand end in FIG. 4D) of the electrode 107 is extending to the end (right-hand end in FIG. 4D) of the $p^+$-photoelectric conversion region 104 and the other end (left-hand end in FIG. 4D) is extending to the end (left-hand end in FIG. 4D) of the p-photoelectric conversion region 103 in the adjacent one of the photoelectric conversion sections 31.

In the charge transfer section 32, an insulation layer 108b of $SiO_2$ is formed on the transfer electrode 107 to cover the top and side faces thereof. The insulation layer 108b is not formed in the photoelectric converting section 31.

In the charge transfer section 32, an insulation layer 109 of $Si_3N_4$ is formed on the insulation layer 108b to cover the entire surface thereof. The insulation layer 109 is not formed in the photoelectric converting section 31.

In both of the charge transfer section 32 and the photoelectric converting section 31, an insulation layer 108c of $SiO_2$ is formed. The insulation layer 108c covers the $Si_3N_4$ insulation layer 109 in the charge transfer section 32 and covers the $SiO_2$ insulation layer 108a in the photoelectric converting section 31.

A light shielding film 110 of aluminum (Al) is formed on the $SiO_2$ film 108c to prevent the incident light from entering the p-well layer 102 in the charge transfer section 32. The light shielding film 110 is not formed in the photoelectric converting section 31.

A protection film 111 of $SiO_2$ is formed to cover the light shielding film 110 in the charge transfer section 32 and to cover the $SiO_2$ insulation film 108c exposed from the light shielding film 110 in the photoelectric converting section 31.

The solid-state imaging device of the first embodiment is fabricated through the sequence shown in FIGS. 4A to 4D.

First, as shown in FIG. 4A, the p-well layer 102 is formed on the n-semiconductor substrate 101. Thus, using photo-lithography and etching methods and an ion-implantation method, the n- and $p^+$-photoelectric conversion regions 103 and 104, the n-charge transfer region 105 and the $p^+$-channel stop region 106 are formed in the p-well layer 102.

Next, the $SiO_2$ insulation layer 108a is formed on the surface of the p-well layer 102 in the photoelectric conversion section 31 and the charge transfer section 32 by thermal oxidizing the substrate 101. A polysilicon film is formed on the $SiO_2$ insulation layer 108a by a chemical vapor deposition (CVD) method and is patterned by photo-lithography and etching methods to form the transfer electrode 107 in the charge transfer section 32, as shown in FIG. 4B.

Subsequently, in the charge transfer section 32, the $SiO_2$ insulation layer 108b with a thickness of about 50 nm is formed on the transfer electrode 107 to cover the top and side faces thereof by thermal oxidizing the polysilicon transfer electrode 107. During this thermally oxidizing process, the silicon oxide film 108b, which is extremely thin (e.g., 50 nm), is formed on the silicon oxide film 108a and also in the photoelectric converting sections 31.

On the $SiO_2$ insulation layer 108b, the $Si_3N_4$ insulation layer 109 with a thickness of about 30 nm is formed on the insulation layer 108b by a CVD method and is patterned by photolithography and etching methods so that only the part covering the insulation layer 108b is left.

Next, in both of the charge transfer section 32 and the photoelectric converting section 31, the $SiO_2$ insulation layer 108c with a thickness of about 20 nm is formed by a CVD method, as shown in FIG. 4C. The insulation layer 108c thus formed covers the $Si_3N_4$ insulation layer 109 in the charge transfer section 32 and covers the $SiO_2$ insulation layer 108a in the photoelectric converting section 31.

The Al light shielding layer 110 is formed on the $SiO_2$ layer 108c in the photoelectric converting section 31 and the charge transfer section 32 by an evaporation method and is patterned by photolithography and etching methods so that only the part covering the insulation layer 108c is left.

Finally, the $SiO_2$ protection film 111 is formed to cover the entirety of the substrate 101. Thus, the solid-state imaging device shown in FIG. 4D is obtained.

The operation of the solid-state imaging device of the first embodiment is the same as that of the conventional examples shown in FIGS. 1, 2 and 3.

As described above, with the solid-state imaging device of the first embodiment, a layered structure composed of the $SiO_2$ insulation layers 108b and 108c with a relatively lower dielectric constant (about 1.45) and the $Si_3N_4$ insulation layer 109 with a relatively higher dielectric constant (about 2.00) between the transfer electrode 107 and the light shielding film 110.

Therefore, intensity of the electric field generated between the transfer electrode 107 and the light shielding film 110 can be reduced compared with that containing no $Si_3N_4$ insulation layer, which means that the distance $d_2$ between the transfer electrode 107 and the light shielding film 110 can be decreased. As a result, the distance $d_1$ between the $p^+$-photoelectric conversion region 104 and the $SiO_2$ protection film 111 can be set smaller with a corresponding decrease of the distance $d_2$.

Accordingly, the smear phenomenon of the incident light can be restrained satisfactorily while maintaining a sufficient dielectric breakdown strength between the transfer electrode 107 and the light shielding film 110.

In the first embodiment, since a layered structure composed of the $SiO_2$ insulation layers 108a and 108c are provided between the $p^+$-photoelectric conversion region 104 and the $SiO_2$ protection film 111 in the photoelectric converting section 31, the distance $d_1'$ can be set shorter than the distance $d_2$. Therefore, the effect of restraining the smear phenomenon of the incident light becomes more remarkable.

In addition, since the layered structure between the $p^+$-photoelectric conversion region 104 and the $SiO_2$ protection film 111 does not contain the $Si_3N_4$ insulation film 109, there is no possibility that the effect of lowering the interface energy level is weakened in the final sintering process step.

SECOND EMBODIMENT

Figure 5:
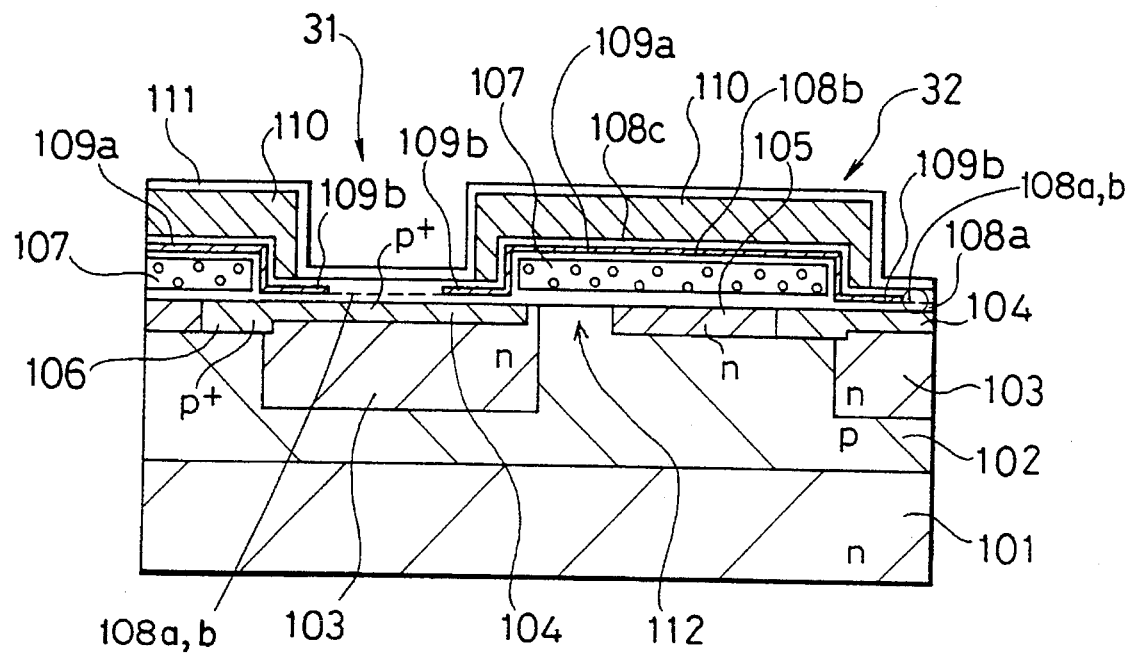
FIG. 5 is a cross-sectional view along the line 1—1' in FIG. 6 showing a solid-state imaging device according to a second embodiment of the present invention.
Figure 6:
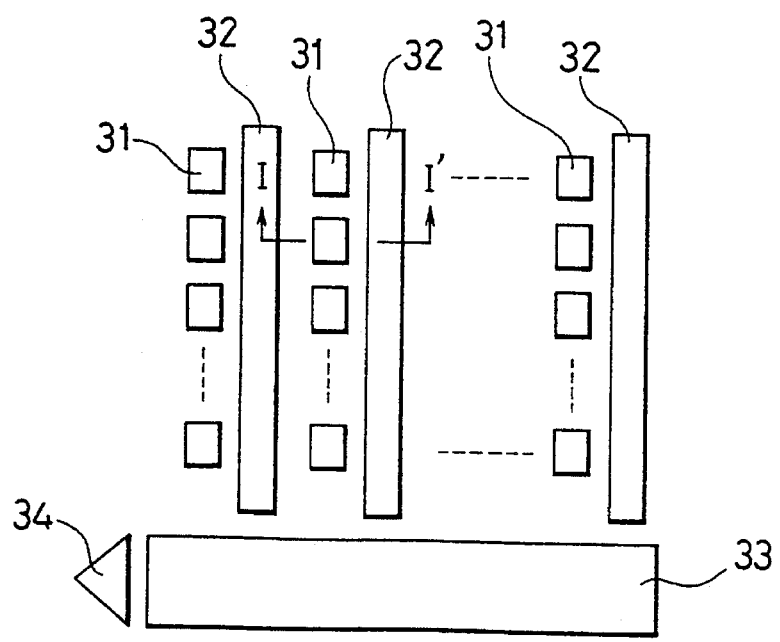
FIG. 6 schematically shows a solid-state imaging device of the interline transfer type.

FIG. 5 shows a solid-state imaging device according to a second embodiment of the present invention.

The solid-state imaging device of the second embodiment is the same in configuration as that of the first embodiment excepting that an $Si_3N_4$ insulation film 109a is provided instead of the $Si_3N_4$ insulation film 109. Both ends 109b of the $Si_3N_4$ insulation film 109a protruded from the ends of the Al light shielding film 110 along the $SiO_2$ insulation film 108a, respectively.

The confronting ends 109b in the photoelectric converting section 31 are disposed in the periphery of the optical path of the incident light, so that the incident light is refracted toward the center of the optical path according to the Snell's law of refraction.

As a result, the obtainable effect of restraining the smear phenomenon of the incident light in the second embodiment can be increased compared with that of the first embodiment.

THIRD EMBODIMENT

Figure 7:
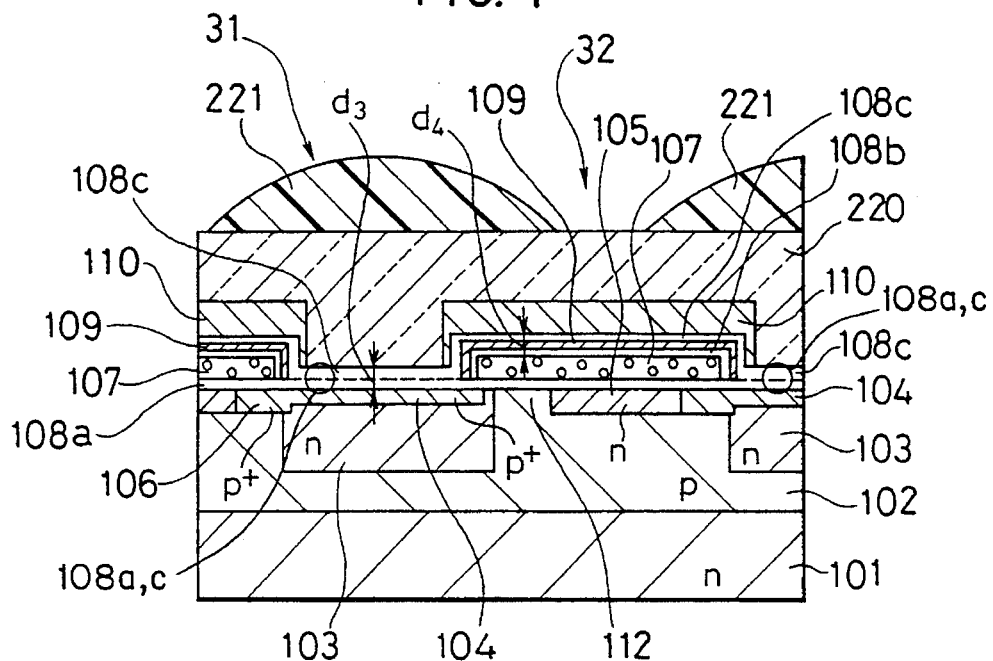
FIG. 7 is a cross-sectional view along the line 1—1' in FIG. 6 showing a solid-state imaging device according to a third embodiment of the present invention.

FIG. 7 shows a solid-state imaging device according to a third embodiment of the present invention.

The solid-state imaging device of the third embodiment is the same in configuration as that of the first embodiment excepting that a flattening film 220 is formed on the light shielding film 110 and the insulation film 108 instead of the protection film 111 and that an array of microlenses 221 are arranged on the flattening film 220 at positions corresponding to the respective photoelectric converting sections 31. The microlenses 221 are made of photosensitive polymer resin.

The third embodiment corresponds to a device obtained by coupling the first embodiment with the second example of the conventional solid-state imaging devices shown in FIG. 2, so that the obtainable effect of restraining the smear phenomenon of the incident light in the third embodiment can be increased compared with that of the first embodiment.

FOURTH EMBODIMENT

Figure 8:
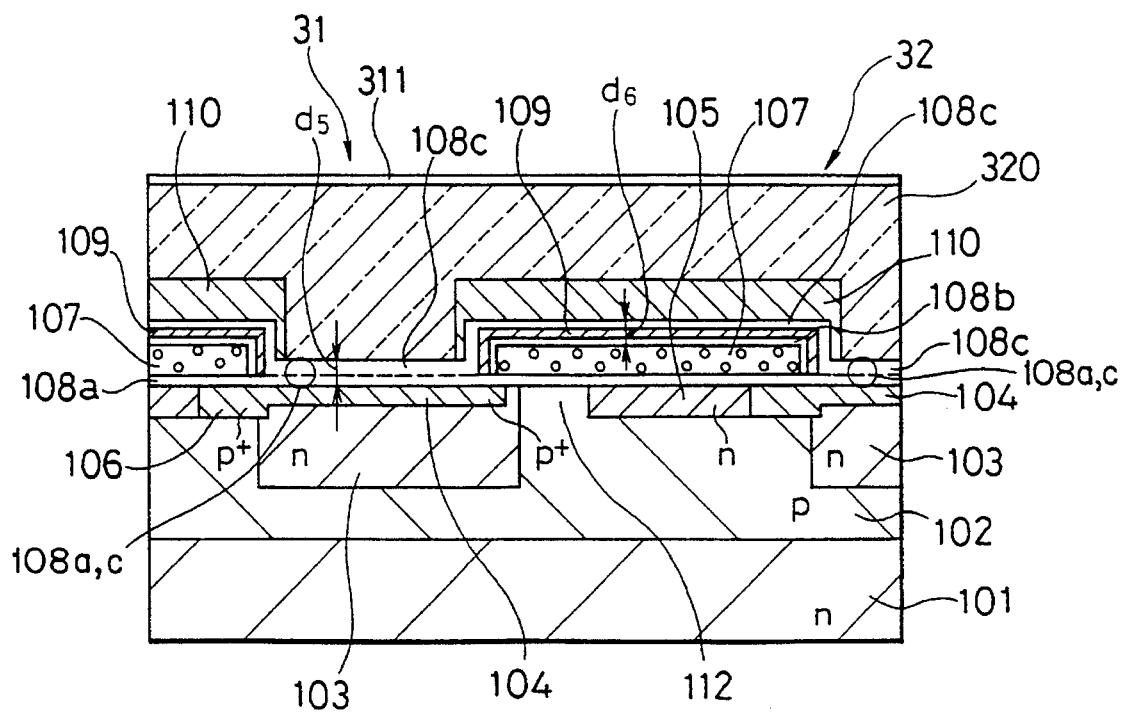
FIG. 8 is a cross-sectional view along the line 1—1' in FIG. 6 showing a solid-state imaging device according to a fourth embodiment of the present invention.

FIG. 8 shows a solid-state imaging device according to a fourth embodiment of the present invention.

The solid-state imaging device of the fourth embodiment is the same in configuration as that of the first embodiment excepting that an $Si_3N_4$ film 320 is formed on the light shielding film 110 and the insulation film 108c instead of the protection film 111 and that an $SiO_2$ protection film 311 is formed on the $Si_3N_4$ film 320.

The fourth embodiment corresponds to a device obtained by coupling the first embodiment with the third example of the conventional solid-state imaging devices shown in FIG. 3, so that the obtainable effect of restraining the smear phenomenon of the incident light in the third embodiment can be increased compared with that of the first embodiment, similar to the third embodiment.

The solid-state imaging devices of the first to fourth embodiments are of the interline transfer type, however, the invention is not limited to this type and any other type of the device such as the frame transfer type may be applied.

Also, though the two-dimensional solid-state imaging devices are described in the above embodiments, the invention can be realized as any type of one-dimensional devices.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A solid-state imaging device comprising:
   photoelectric converting regions formed at a semiconductor substrate;
   a first insulating film covering said photoelectrical converting regions, each of said photoelectrical converting regions receiving incident light through said first insulation film to generate and store a signal charge according to said incident light thus received;

a charge transfer region formed at said semiconductor substrate;

a second insulating film covering said charge transfer region;

transferring electrodes formed on said second insulating film;

a third insulating film covering said transferring electrodes, said third insulating film being of a layered structure including a first insulation layer, a second insulation layer with a dielectric constant greater than that of said layer, and a third insulation layer with a dielectric constant less than that of the second insulation layer, and said signal charges stored in said photoelectrical converting regions being transferred through said charge transfer region in response to a transfer signal applied to said transferring electrodes; and a light shielding film covering said third insulating film to prevent said incident light from entering said charge transfer region, said light shielding film having windows over said respective photoelectrical converting regions so that said incident light enters said photoelectrical converting regions through said windows, wherein said second insulation layer has edges laterally protruding from said light shielding film to a peripheral area of said respective photoelectric converting regions over said corresponding light-receiving surfaces of said photoelectric converting regions; and wherein said incident light entering through said windows of said light shielding film is refracted by said protruding ends of said second insulation layer toward respective centers of said ligth-receiving surfaces.

2. A solid-state imaging device as claimed in claim 1, wherein said first insulating film at least in part is made of the same material as that of said second insulating film.

3. A solid-state imaging device as claimed in claim 1, wherein said first insulation layer and said third insulation layer are made of silicon oxide and said second insulation layer is made of silicon nitride.

4. A solid-state imaging device as claimed in claim 1, wherein said first insulation layer and said third insulation layer have a dielectric constant of approximately 1.45 and said second insulation layer has a dielectric constant of approximately 2.00.

* * * * *